United States Patent [19]

Brown et al.

[11] 3,763,552

[45] Oct. 9, 1973

[54] METHOD OF FABRICATING A TWISTED COMPOSITE SUPERCONDUCTOR

[75] Inventors: Gerald V. Brown, Lakewood; Willard D. Coles, Fairview Park; James C. Laurence, Olmsted Falls, all of Ohio

[73] Assignee: The United States of America as represented by the Administrator of the National Aeronautics and Space Administration, Washington, D.C.

[22] Filed: Mar. 16, 1972

[21] Appl. No.: 235,266

[52] U.S. Cl. ........ 29/599, 174/126 CP, 174/DIG. 6, 335/216

[51] Int. Cl. .......... H01v 11/00

[58] Field of Search .......... 29/599; 174/126 CP, 174/DIG. 6; 335/216

[56] References Cited

UNITED STATES PATENTS

| | | | |
|---|---|---|---|
| 3,686,750 | 8/1972 | Woolcock et al. | 174/126 CP |
| 3,699,647 | 10/1972 | Bidault et al. | 29/599 |
| 3,525,637 | 8/1970 | Kyongmin Kim | 29/599 X |
| 3,218,693 | 11/1965 | Allen et al. | 29/599 |
| 3,625,662 | 12/1971 | Roberts et al. | 29/599 |

*Primary Examiner*—Charles W. Lanham
*Assistant Examiner*—D. C. Reiley, III
*Attorney*—N. T. Musial et al.

[57] ABSTRACT

A method of producing a twisted, stabilized wire or tube superconductor which can be used to wind electromagnets, armatures, rotors, field windings for motors and generators, and other magnetic devices which use a solenoid, toroidal, or other type winding. At least one groove is formed along the length of a wire substrate which is then twisted into a helix and a layer of intermetallic superconducting material is formed in the groove. This layer can be formed by depositing the desired intermetallic compound into the groove or by diffusing one component of the superconductor into the groove formed in a substrate composed of the other component. The superconductor prepared by this method comprises a non-superconductor wire twisted into the shape of a helix, having at least one groove containing a layer of superconductor material along the length of the wire.

10 Claims, 5 Drawing Figures

METHOD OF FABRICATING A TWISTED COMPOSITE SUPERCONDUCTOR

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

1. Field of the Invention

The present invention relates to intermetallic compound superconductors; specifically it relates to intermetallic compound superconductors in a twisted form useful for electromagnet windings.

2. Description of the Prior Art:

The brittleness of intermetallic superconductor materials has severely restricted the use of these unique compounds in aeronautical and astronautical applications. This is especially true where small and light weight windings are required.

Intermetallic superconductors have been used in large size windings where their brittleness was not a factor. An example of this type of use is disclosed in U.S. Pat. No. 3,548,078, which teaches embedding a superconductor wire in a substrate composed of a normal conducting material.

Techniques for forming smaller superconductor elements are disclosed in U.S. Pat. Nos. 3,504,283 and 3,352,007. The former patent teaches a method of forming a superconducting material into a solenoid by first depositing a thin film of superconducting material upon the surface of a nonmagnetic cylinder and then removing a selected portion of the material to leave a thin film superconductor in the shape of a solenoid. The latter patent illustrates a diffusion method of forming a superconductor by removing a portion of wax in the shape of a spiral from a wax coated ceramic cylinder and then impregnating the exposed portion of the ceramic with a molten metal capable of being rendered superconducting. Both of these techniques require the use of relatively large and heavy nonconducting substrates and therefore have little utility in aeronautical and astronautical applications where small size and low weight are necessary.

A similar size and weight disadvantage is applicable to commonly used alloy superconducting composites, such as twisted filaments of niobium-titanium. These composites suffer the further disadvantage of not producing the intense magnetic fields or high current densities of intermetallic compound superconductors.

SUMMARY OF THE INVENTION

The object of the present invention is to provide a relatively small and light weight superconductor winding useful in aeronautical and astronautical applications.

Another object is to provide an intermetallic superconductor in the form of a twisted stabilized wire.

These objects are accomplished by twisting a wire containing at least one groove extending along its length to form the groove into a helix having a predetermined number of turns per unit length and then forming a layer of intermetallic superconductor in the groove by vapor deposition or diffusion.

DESCRIPTION OF THE PREFERRED EMBODIMENTS

Figure 1:
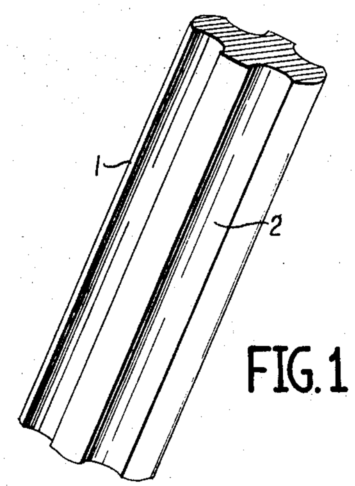
FIG. 1 depicts a segment of a substrate wire used in this invention.
Figure 2:
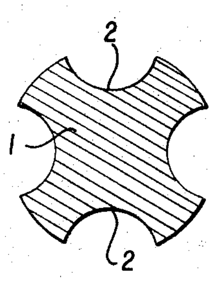
FIG. 2 illustrates an end view of the substrate wire of FIG. 1.

The substrate which forms the base of the twisted superconductor comprises a normal conducting material having at least one groove formed along its length. The grooves may be formed by any conventional technique either at the time the wire is drawn or extruded or after the wire is formed by swagging, for example. FIGS. 1 and 2 illustrate a segment and an end view of a substrate wire 1 having a plurality of grooves 2. The normal conducting materials which may form the substrate include stainless steel, niobium, Hastelloy and vanadium. The only requirements for the substrate material are that it be sufficiently ductile to enable it to be twisted into the desired configuration and that it be compatible with the superconductor material to be deposited.

The substrate containing the grooves is next twisted forming each groove into a helix having a predetermined diameter and number of turns per unit of length. This helical configuration is shown by the helical grooves 2 on the twisted substrate 1 in FIG. 4.

A layer of intermetallic superconducting material is then formed in the grooves 2. This layer can be formed either by depositing the superconductor on the groove surface or by diffusing a compound, which forms an intermetallic superconductor with the substrate material, into the surface of the groove.

The intermetallic superconductor may be deposited by any conventional procedure, such as vapor deposition, metalized spray and sputtering. The vapor deposition of niobium-stannide from niobium pentachloride and stannous dichloride will be described for purposes of illustration.

Figure 3:
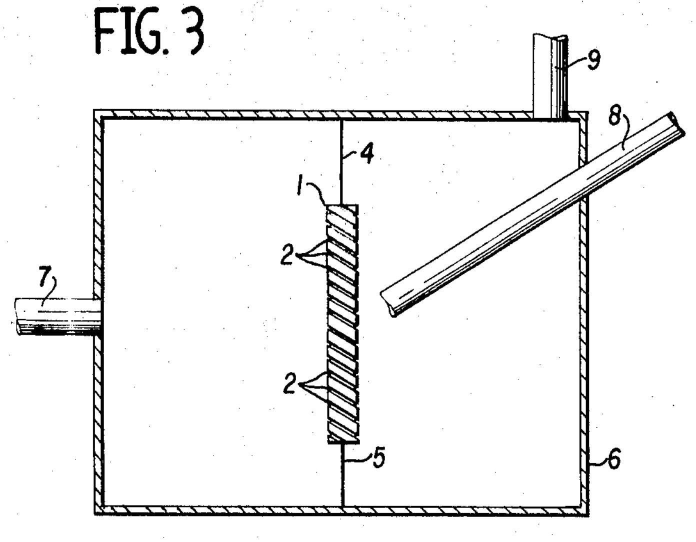
FIG. 3 depicts the twisted substrate in the deposition chamber used to vapor deposit the intermetallic superconductor.

The twisted wire substrate 1 is connected to electrical leads 4 and 5 in deposition chamber 6 shown in FIG. 3. The leads 4 and 5 are connected to an electrical power source which is not shown. This causes the substrate to heat in accordance with the method which will now be described. The chloride and hydrogen gases enter the deposition chamber through conduits 7 and 8, respectively. Exhaust conduit 9 serves as an exit from the chamber. Prior to starting the deposition process the chamber 6 is purged with helium gas. The chamber 6 is then heated and maintained at a temperature between 600° and 750° C., preferably 675° C. The substrate is heated to a temperature of between 850° C. and 1,100° C., preferably 900° C. Vaporized niobium pentachloride and stannous dichloride are introduced into the chamber through conduit 7. In the chamber the chlorides are mixed with hydrogen which enters the chamber through conduit 8. It is desirable that the hydrogen be introduced directly into the deposition zone and preferably the hydrogen inlets should be directed at the heated substrate. The hydrogen reduces the mixed chlorides to form $Nb_3Sn$ on the substrate surface.

The $Nb_3Sn$ covering the land area of the substrate is then removed by conventional photoresist-chemical etching techniques. One such method comprises covering the $Nb_3Sn$ coated substrate with Kodak Metal Etch Resist (KMER); then setting the resist and removing the unset portion from the nongrooved areas. Finally the exposed $Nb_3Sn$ is etched away with KOH heated to from about 90° C. to 100° C.

An alternative method of forming a niobium-stannide layer comprises immersing a twisted niobium substrate in a molten tin bath maintained in a vacuum or inert atmosphere and heated to a temperature of approximately 950° C. The molten bath may contain small amounts of a third material such as zirconium to improve the superconducting properties. The $Nb_3Sn$ layer on the nongrooved areas is removed by the same technique as is used in the vapor deposition technique described above. Alternatively, the land areas of the niobium substrate are masked to prevent diffusion of the tin into these surfaces. One method of accomplishing this result is to coat the wire with a layer of copper and then with a second layer of nickel. This pre-coated substrate is then dipped in the molten tin bath.

The diffusion process can also be performed by applying one component of the intermetallic superconductor to a substrate comprising the other component, by vapor deposition, sputtering, or metallized spraying. Thus a layer of tin may be applied to a niobium substrate. The coated substrate is then heated to a temperature sufficiently high to diffuse the coated material into the substrate and thus form the intermetallic compound.

Figure 4:
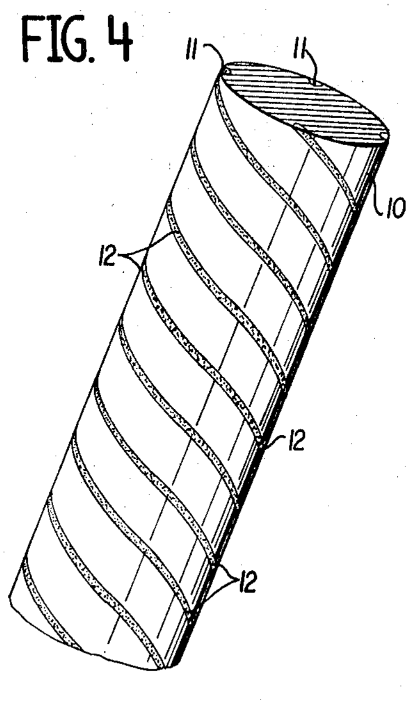
FIG. 4 shows the twisted superconductor of this invention.

The superconductor formed by the above process is illustrated in FIG. 4 and comprises a twisted wire substrate 10 having at least one helical groove 11 containing a layer of intermetallic superconductor 12 and extending along the length of the substrate. The substrate in an exemplary case is composed of stainless steel, niobium, Hastelloy or vanadium and the intermetallic compound is $Nb_3Sn$. It should be recognized that any other ductile material can be used as a substrate and any intermetallic superconductor can be used to coat the grooved areas.

Intermetallic compounds which can be deposited in the helical grooves of the substrate in accordance with the method of the invention include $V_3Ga$, NbN, $V_3Si$, $Nb_3Al$, $Nb_3Ga$, $Nb_3Sn$, and $Nb_3(AlGe)$. $Nb_3Ga$ has the highest known critical temperature for a binary compound superconductor while $Nb_3(AlGe)$ has the highest known critical temperature of any known superconductor at the present time.

Figure 5:
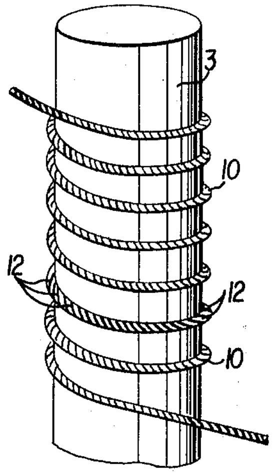
FIG. 5 illustrates a magnet constructed by winding the superconducting wire around a core.

FIG. 5 illustrates a magnet constructed by winding a wire made in accordance with the invention around a core 3. Because of the helical form of the superconductor material, superconducting eddy currents which are detrimental are cancelled out.

What is claimed is:

1. A method of forming a twisted composite superconducting wire comprising:

a. forming at least one groove in a substrate wire extending along the length of said wire, b. twisting the wire about its longitudinal axis to form the groove into a helix, and then c. forming a layer of superconducting material in said helical groove.

2. The method of forming a twisted superconducting wire according to claim 1 wherein said substrate wire is selected from the group of metals consisting of stainless steel, niobium, Hastelloy and vanadium.

3. The method of forming a twisted superconducting wire according to claim 1 wherein said superconducting material is an intermetallic compound.

4. The method of forming a twisted superconducting wire according to claim 3 wherein said intermetallic compound is $Nb_3Sn$.

5. The method of forming a twisted superconducting wire according to claim 1 wherein said superconducting material is vapor-deposited in said groove.

6. The method of forming a twisted superconducting wire according to claim 5 wherein said superconducting material is vapor-deposited in the groove by passing a mixture of vaporized niobium pentachloride, tin dichloride and hydrogen over the substrate wire heated to a temperature sufficient to reduce the chlorides and form $Nb_3Sn$.

7. The method of forming a twisted superconducting wire according to claim 6 wherein said wire is heated to a temperature of approximately 900° C.

8. A method of forming a twisted superconducting wire according to claim 3 wherein said wire substrate comprises one element of said intermetallic compound and the layer of superconducting material is formed by diffusing the second component of said intermetallic compound into the surface of the groove.

9. A method of forming a twisted superconducting wire according to claim 8 wherein said substrate comprises niobium and said second component is tin.

10. A method of forming a twisted superconducting wire according to claim 9 wherein the tin is diffused into the grooves by immersing the twisted wire into a molten tin bath at a temperature of approximately 950° C.

* * * * *